United States Patent
Kim et al.

(10) Patent No.: US 7,823,031 B2
(45) Date of Patent: Oct. 26, 2010

(54) METHOD AND SYSTEM FOR TESTING SEMICONDUCTOR MEMORY DEVICE USING INTERNAL CLOCK SIGNAL OF SEMICONDUCTOR MEMORY DEVICE AS DATA STROBE SIGNAL

(75) Inventors: Jun-bae Kim, Dobong-gu (KR); Jin-ho Ryu, Seocho-gu (KR); Sung-man Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 274 days.

(21) Appl. No.: 11/781,380

(22) Filed: Jul. 23, 2007

(65) Prior Publication Data

US 2008/0025115 A1    Jan. 31, 2008

(30) Foreign Application Priority Data

Jul. 31, 2006    (KR) ...................... 10-2006-0072248

(51) Int. Cl.
    *G11C 29/00*    (2006.01)
(52) U.S. Cl. ...................... 714/718; 365/192; 365/201; 714/5; 714/700; 714/707; 714/721; 714/731; 714/744
(58) Field of Classification Search ........................ None
    See application file for complete search history.

(56) References Cited

U.S. PATENT DOCUMENTS

| | | | |
|---|---|---|---|
| 6,339,555 B1 * | 1/2002 | Hamada et al. ............. | 365/201 |
| 6,385,129 B1 * | 5/2002 | Silvestri ................... | 365/233.1 |
| 6,871,306 B2 * | 3/2005 | Ernst et al. .................. | 714/718 |
| 7,053,686 B2 * | 5/2006 | Lee ............................. | 327/198 |
| 7,284,369 B2 * | 10/2007 | Nakano et al. ................ | 60/289 |
| 7,411,839 B2 * | 8/2008 | Cha ....................... | 365/189.05 |
| 7,457,176 B2 * | 11/2008 | Dono ......................... | 365/193 |
| 7,587,645 B2 * | 9/2009 | Chang et al. ................ | 714/738 |
| 7,603,246 B2 * | 10/2009 | Newcomb et al. ............. | 702/89 |
| 2002/0009004 A1 * | 1/2002 | Hamada et al. ............. | 365/201 |
| 2002/0170003 A1 * | 11/2002 | Hirabayashi .................. | 714/42 |
| 2003/0031082 A1 * | 2/2003 | Sawada ...................... | 365/233 |
| 2005/0060600 A1 * | 3/2005 | Jeddeloh ........................ | 714/5 |
| 2005/0135167 A1 * | 6/2005 | Manabe ....................... | 365/201 |
| 2005/0271179 A1 * | 12/2005 | Hasegawa et al. ........... | 375/371 |

FOREIGN PATENT DOCUMENTS

| | | | |
|---|---|---|---|
| JP | 2004145999 | | 5/2004 |
| KR | 1020020037525 | * | 5/2002 |
| KR | 1020020037525 A | | 5/2002 |
| KR | 1020040095967 A | | 11/2004 |
| KR | 1020050109813 A | | 11/2005 |
| KR | 1020060022946 A | | 3/2006 |

* cited by examiner

*Primary Examiner*—John P Trimmings
(74) *Attorney, Agent, or Firm*—Volentine & Whitt, PLLC

(57) ABSTRACT

Provided are a method and system for testing a semiconductor memory device using an internal clock signal of the semiconductor memory device as a data strobe signal. The internally-generated data strobe signal may be delayed to synchronize with test data. Because a test device need not supply the data strobe signal, the number of semiconductor memory modules that can be simultaneously tested can be increased, and an average test time for a unit memory module can be decreased.

10 Claims, 5 Drawing Sheets

METHOD AND SYSTEM FOR TESTING SEMICONDUCTOR MEMORY DEVICE USING INTERNAL CLOCK SIGNAL OF SEMICONDUCTOR MEMORY DEVICE AS DATA STROBE SIGNAL

BACKGROUND OF THE INVENTION

1. Field of the Invention

The present invention relates generally to a semiconductor memory device, and more particularly, but not by way of limitation, to a method and system for testing a semiconductor memory device at high speed using a data storage signal generated from an internal clock signal of the semiconductor memory device so as to increase the number of memory modules that can be simultaneously tested and reduce a test time for a unit memory module.

This application claims the benefit of Korean Patent Application No. 10-2006-0072248, filed on Jul. 31, 2006, in the Korean Intellectual Property Office, the disclosure of which is incorporated herein in its entirety by reference.

2. Description of the Related Art

As semiconductor memory devices become highly integrated, the time required to test the semiconductor memory devices is increased. Accordingly, high-speed test techniques have been developed in order to reduce the test time. Furthermore, methods for simultaneously testing a larger number of semiconductor memory modules have also been developed.

However, the number of semiconductor memory modules that can be simultaneously tested is restricted by the number of test channels of a test device, and the number of test channels is restricted by the number of signals applied to the semiconductor memory modules. The number of test channels indicates the number of memory modules that can be simultaneously tested by the test device. That is, the number of semiconductor memory modules that can be simultaneously tested is determined by the number of signals applied to the semiconductor memory modules.

The test device applies test data through test channels to semiconductor memory modules respectively corresponding to the test channels. In this case, a data strobe signal used to sample the test data is also applied to the semiconductor memory modules through a test channel. Thus, when the test device applies the data strobe signal to the semiconductor memory modules, the number of test channels is reduced. This restricts the number of semiconductor memory modules that can be simultaneously tested.

SUMMARY OF THE INVENTION

An embodiment of the present invention provides a test method capable of increasing the number of semiconductor memory modules that can be simultaneously tested so as to reduce a test time for a unit memory module.

An embodiment of the present invention also provides a semiconductor memory device capable of increasing the number of semiconductor memory modules that can be simultaneously tested so as to reduce a test time for a unit memory module.

According to an aspect of the present invention, there is provided a method of testing a semiconductor memory device, including: generating an internal data strobe signal within a semiconductor memory device; and receiving test data in the semiconductor memory device from a test device, the internal data strobe signal being synchronized with the test data.

According to an aspect of the present invention, there is provided a semiconductor memory device, including: a data strobe signal buffer configured to buffer at least one data strobe signal; and a data strobe signal generator coupled to the data strobe buffer and configured to generate an internal data strobe signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
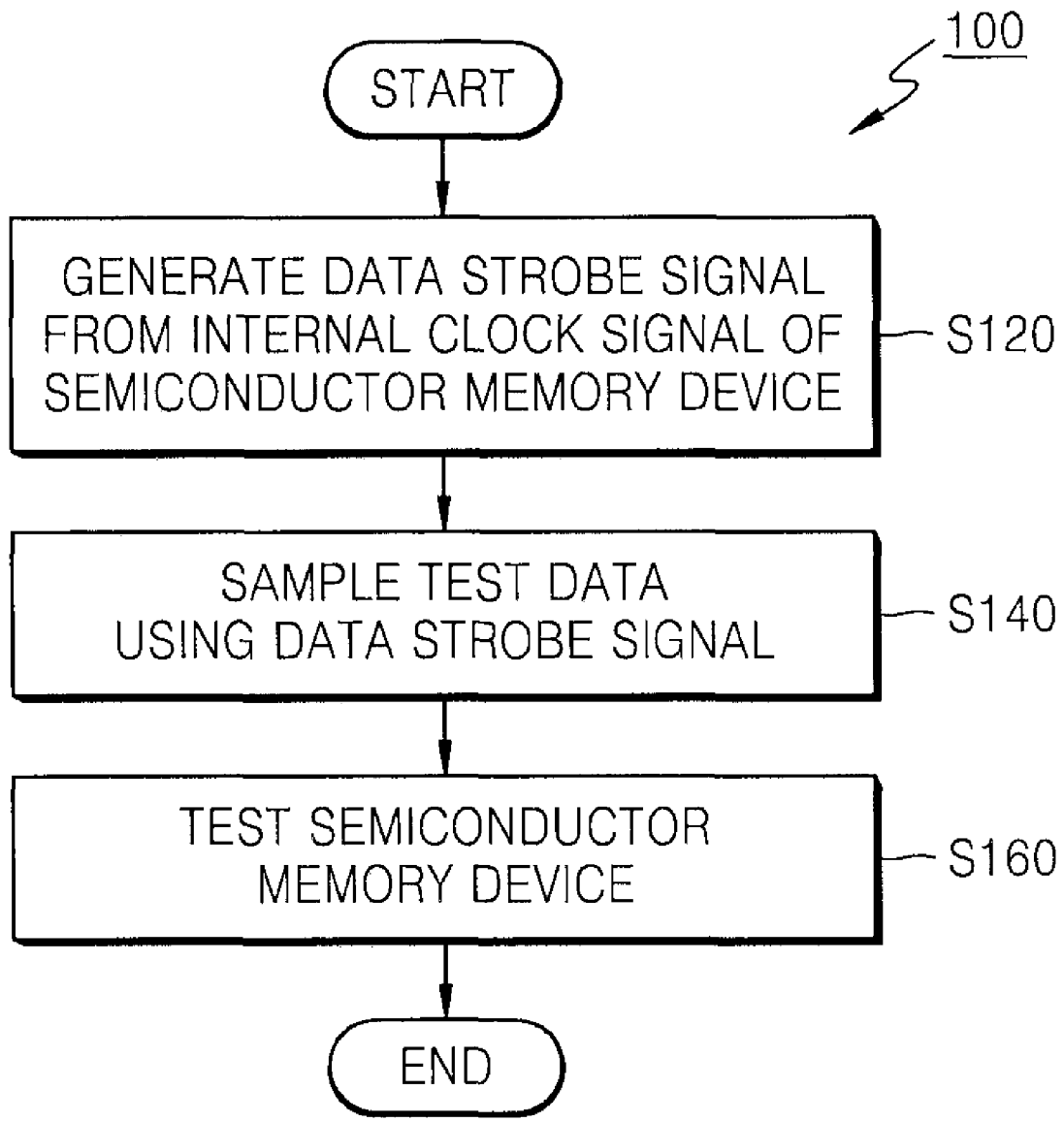
FIG. 1 is a flow chart of a method of testing a semiconductor memory device according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. Throughout the drawings, like reference numerals refer to like elements.

FIG. 1 is a flow chart of a method 100 of testing a semiconductor memory device according to an embodiment of the present invention. Referring to FIG. 1, the method 100 of testing a semiconductor memory device according to an embodiment of the present invention includes an operation S120 of generating a data strobe signal using an internal clock signal of the semiconductor memory device, an operation S140 of sampling test data using the data strobe signal, and an operation S160 of testing the semiconductor memory device using the data strobe signal. In the illustrated embodiment, steps S120, S140, and S160 are performed in sequence.

Figure 4:
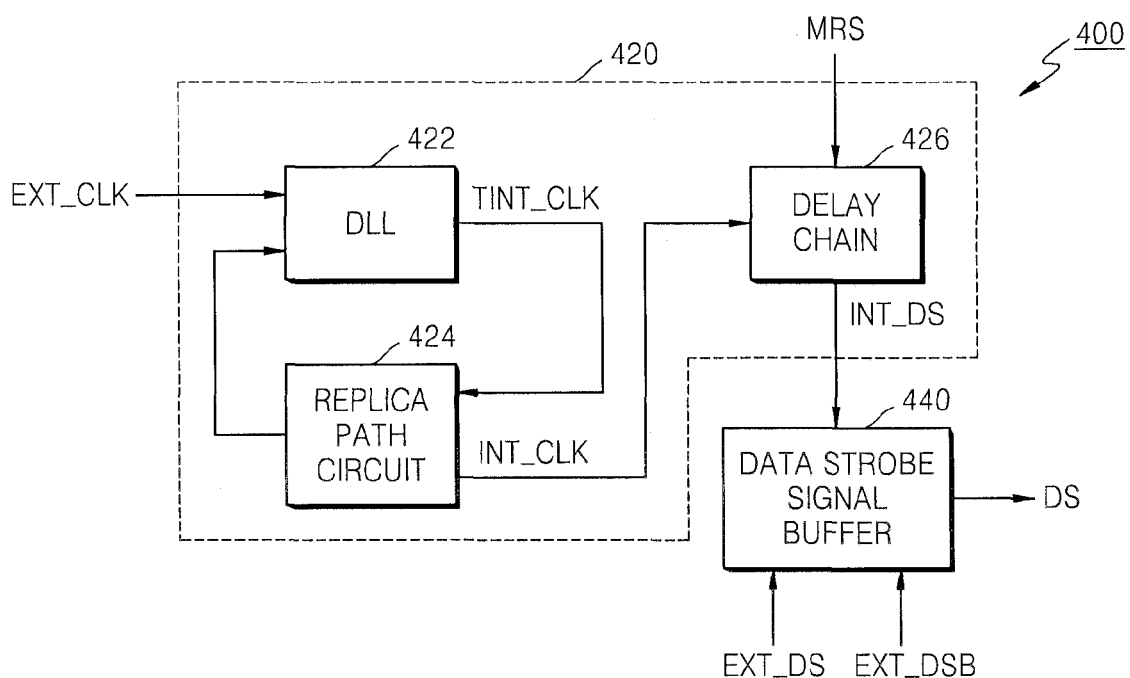
FIG. 4 is a block diagram of a semiconductor memory device according to an embodiment of the present invention.

FIG. 4 is a block diagram of a semiconductor memory device 400 according to an embodiment of the present invention. Referring to FIG. 4, a system for testing a semiconductor memory device according to an embodiment of the present invention includes the semiconductor memory system 400 and a test device (not shown). The semiconductor memory device 400 includes a data strobe signal buffer 440 coupled to a data strobe signal generator 420. The data strobe signal generator 420 may further include a delayed locked loop (DLL) 422, a replica path circuit 424 and/or a delay chain 426.

The data strobe signal generator 420 is configured to receive an external clock signal EXT_CLK, generate an internal clock signal INT_CLK based on the external clock signal EXT_CLK, and output an internal data strobe signal INT_DS based on the internal clock signal INT_CLK. In one embodiment, the internal data strobe signal INT_DS is equal to the internal clock signal INT_CLK. In another embodiment, the internal data strobe signal INT_DS is modified from the internal clock signal INT_CLK.

The data strobe signal buffer 440 is configured to buffer and output a data strobe signal DS. In an alternative embodiment, the data strobe signal buffer 440 is further configured to select from multiple data strobe signal inputs.

The method 100 for testing the semiconductor memory device according to an embodiment of the present invention will be explained with reference to FIGS. 1 and 4. The method 100 generates the data strobe signal DS using the semiconductor memory device 400 in operation S120. In the present embodiment, the data strobe signal DS is generated using the internal clock signal INT_CLK of the semiconductor memory device 400. The semiconductor memory device 400 samples test data using the data strobe signal DS in operation S140. The test data is input to the semiconductor memory device 400 in order to test the semiconductor memory device 400 in operation S160. As used herein, "sampling test data," and variations thereof, refers to reading at least a portion of test data and "testing a semiconductor memory device," and variations thereof, refers to all reading and writing associated with testing a semiconductor memory device.

Figure 5A:
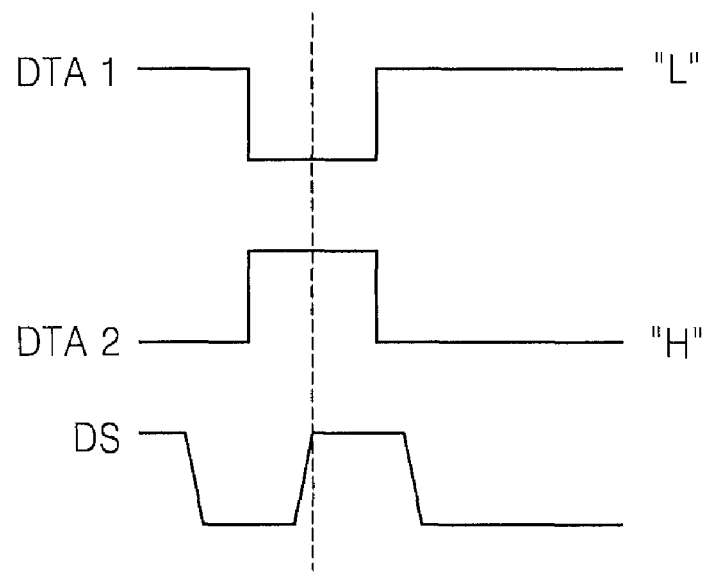
FIGS. 5A and 5B are timing diagrams of an operation of sampling data using a data strobe signal according to an embodiment of the present invention.
Figure 5B:
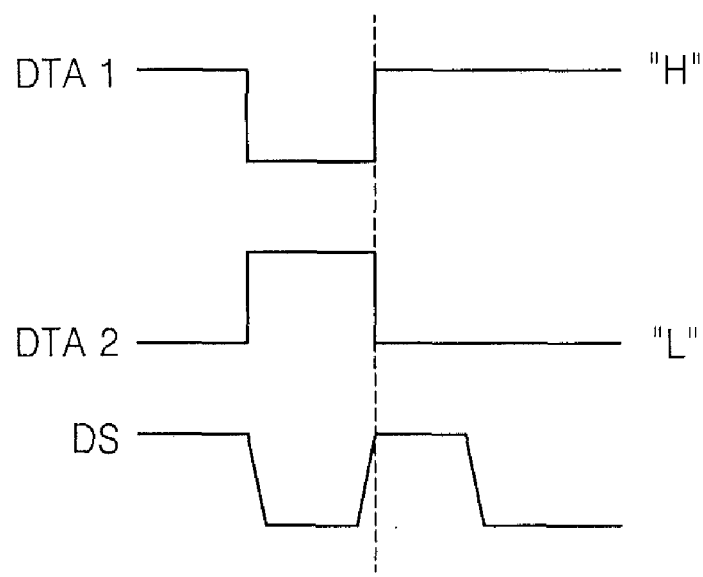

FIGS. 5A and 5B are timing diagrams of the operation of sampling data using the data strobe signal according to an embodiment of the present invention. Referring to FIG. 5A, data DTA1 at a logic low level and DTA2 at a logic high level are sampled at a rising edge of the data strobe signal DS. The data strobe signal DS is correctly synchronized with the data DTA1 and the data DTA2, and thus it properly samples the data DTA1 and DTA2 at the centers of pulses of the data DTA1 and DTA2. Accordingly, the logic levels of the data DTA1 and the data DTA2 are correctly detected as a low level "L" and a high level "H", respectively.

In FIG. 5B, the data strobe signal DS is not synchronized with the data DTA1 and DTA2, and thus it samples the data DTA1 at a rising edge of the data DTA1 and samples the data DTA2 at a falling edge of the data DTA2. Accordingly, the logic level of the data DTA1 may be incorrectly detected as a logic high level "H," and the logic level of the data DTA2 may be incorrectly detected as a logic low level "L". FIGS. 5A and 5B illustrate that the data strobe signal DS can be used to detect correct logic levels of the data DTA1 and DTA2 only when the data strobe signal DS is clocked in proper synchronization with the data DTA1 and DTA2.

The internal clock signal INT_CLK of the semiconductor memory device 400 may not be synchronized with the test data, however. Accordingly, an embodiment of the present invention provides a method for synchronizing the internal clock signal INT_CLK with the test data.

Figure 2:
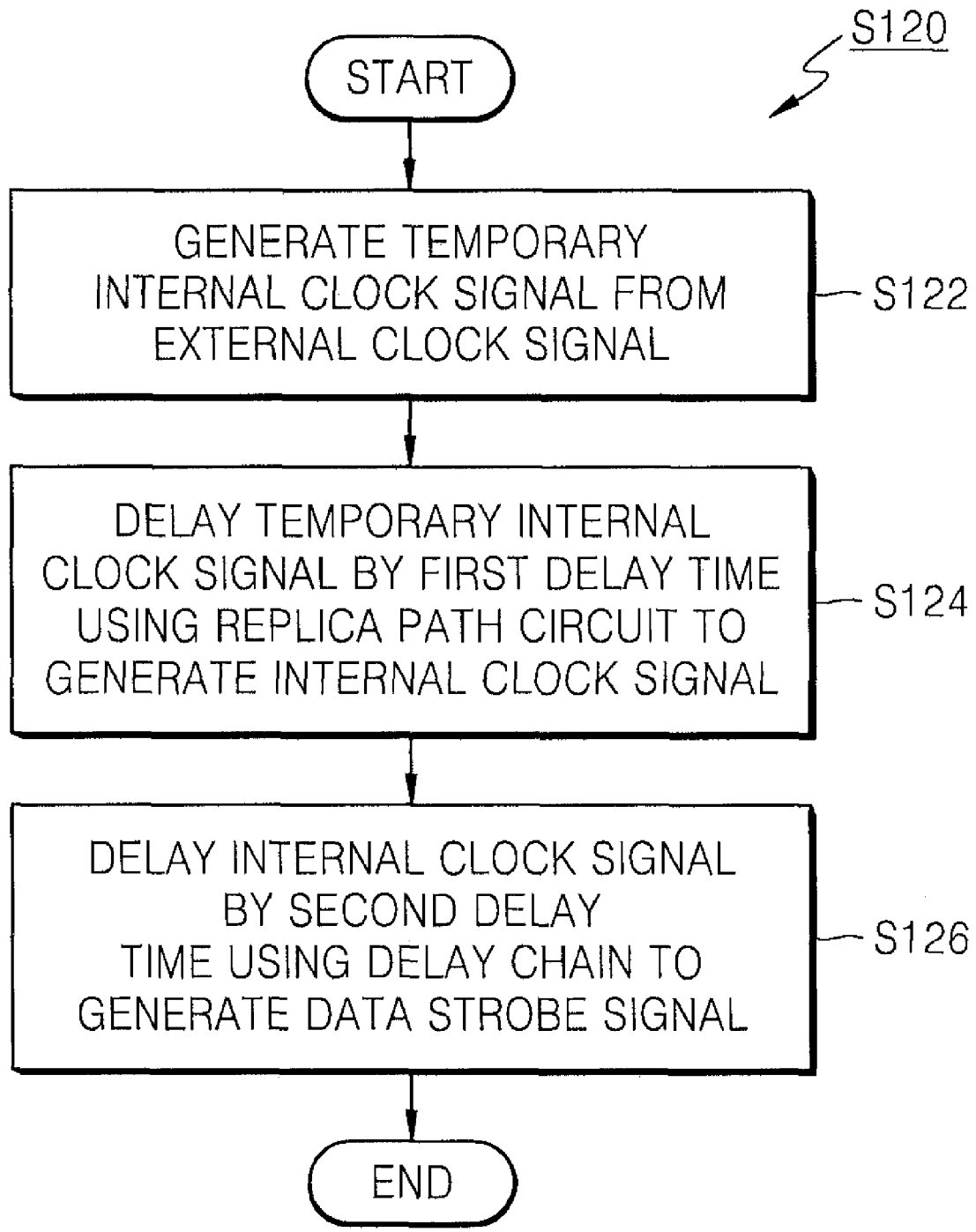
FIG. 2 is a flow chart of an operation for generating a data strobe signal, according to an embodiment of the present invention.

FIG. 2 is a flow chart of an operation for generating a data strobe signal, according to an embodiment of the present invention. The method illustrated in FIG. 2 may be used to perform operation S120. Referring to FIGS. 2 and 4, the semiconductor memory device 400 generates a temporary internal clock signal TINT_CLK from an external clock signal EXT_CLK in operation S122. A delay locked loop (DLL) circuit 422 of the semiconductor memory device 400 may be used to generate the temporary internal clock signal TINT_CLK. The temporary internal clock signal TINT_CLK is delayed by a predetermined time so as to be synchronized with the test data.

The temporary internal clock signal TINT_CLK is delayed during two stages. Specifically, the temporary internal clock signal TINT_CLK output from the DLL circuit 422 is delayed by a first delay time in operation S124. Here, a replica path circuit 424 is used to delay the temporary internal clock signal TINT_CLK by the first delay time. The replica path circuit 424 models a period of time from when the external clock signal EXT_CLK is applied to the semiconductor memory device 400 to when the internal clock signal INT_CLK is generated by the semiconductor memory device 400.

Figure 6A:
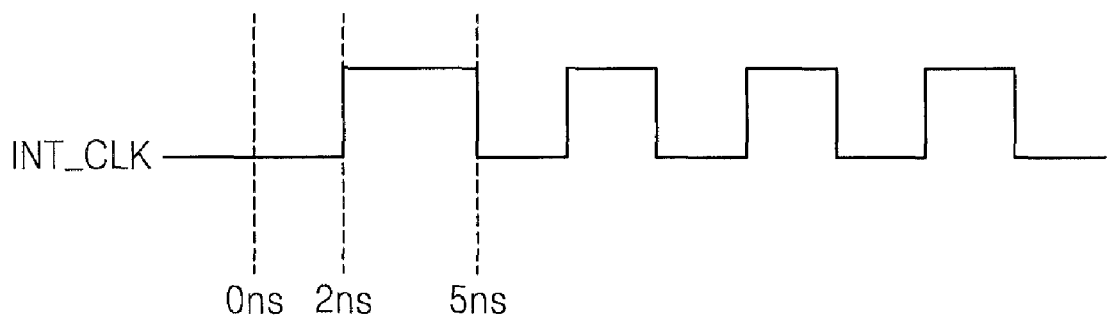
FIGS. 6A and 6B are timing diagrams of an operation of delaying an internal clock signal by a predetermined time using a replica path circuit illustrated in FIG. 4, according to an embodiment of the present invention.
Figure 6B:
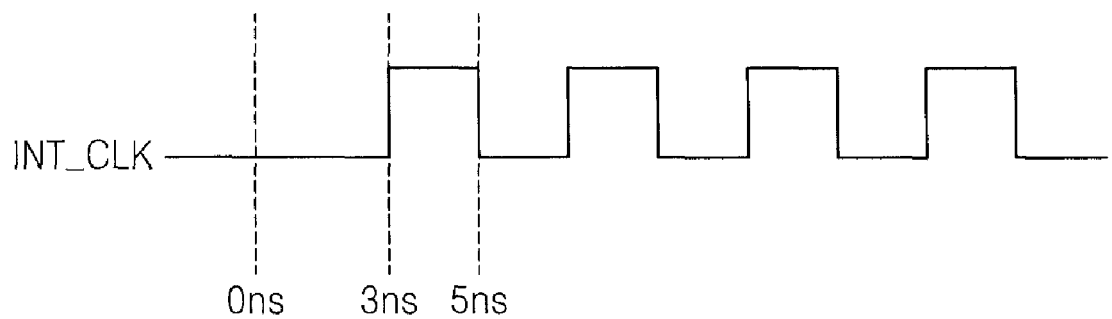

FIGS. 6A and 6B are timing diagrams of the operation of delaying the internal clock signal INT_CLK by a predetermined time using the replica path circuit 424 illustrated in FIG. 4, according to an embodiment of the present invention.

Referring to FIGS. 4 and 6A, when it is assumed that it takes 5 ns to output the test data after the external clock signal EXT_CLK is applied to the semiconductor memory device 400 and it takes 2 ns to generate the internal clock signal INT_CLK from the external clock signal EXT_CLK, the replica path circuit 424 delays the internal clock signal by 3 ns. In FIG. 6A, the first pulse of the internal clock signal INT_CLK rises at 2 ns and the replica path circuit 424 adds a delay time of 3 ns, and thus the internal clock signal INT_CLK starts clocking at 5 ns. That is, the replica path circuit 424 controls the first rising edge of the internal clock signal INT_CLK.

Referring to FIGS. 4 and 6B, when it is assumed that it takes 5 ns to output the test data after the external clock signal EXT_CLK is applied to the semiconductor memory device 400 and it takes 3 ns to generate the internal clock signal INT_CLK from the external clock signal EXT_CLK, the replica path circuit 424 delays the internal clock signal by 2 ns. In FIG. 6B, the first pulse of the internal clock signal INT_CLK rises at 3 ns and the replica path circuit 424 adds a delay time of 2 ns, and thus the internal clock signal INT_CLK starts clocking at 5 ns.

As described above, the internal clock signal INT_CLK can be adaptively delayed by the replica path circuit 424 according to the semiconductor memory device 400 to properly synchronize the internal clock signal INT_CLK with the test data.

In order to more accurately synchronize the internal data strobe signal INT_DS with the test data, a delay chain 426 can be used to further delay internal clock signal INT_CLK in operation S126. The delay chain 426 of the semiconductor memory device 400 determines the second delay time in response to an MRS (mode register set) signal. The first delay time (associated with operation S124) can be longer than the second delay time (associated with operation S126). For example, while the first delay time may be 1 ns, the second delay time may be 0.3 ns. That is, the semiconductor memory device 400 may synchronize the internal clock signal INT_CLK with the test data more accurately using the second delay time.

The internal clock signal INT_CLK delayed by a predetermined time is output as the data strobe signal INT_DS. The data strobe signal DS is applied to a data input buffer (not shown) in order to sample the test data.

In embodiments of the present invention, the internal data strobe signal INT_DS is generated from the semiconductor memory device 400. Thus, the test device (not shown) need not supply external data strobe signal EXT_DS to the semiconductor memory device 400. In this instance, the test device (not shown) can use channels otherwise used to output the external data strobe signal EXT_DS for test data. Therefore, methods and systems for testing a semiconductor memory device according to embodiments of the present invention can increase the number of memory modules that can be simultaneously tested and can likewise reduce the test time for a unit memory module.

Figure 3:
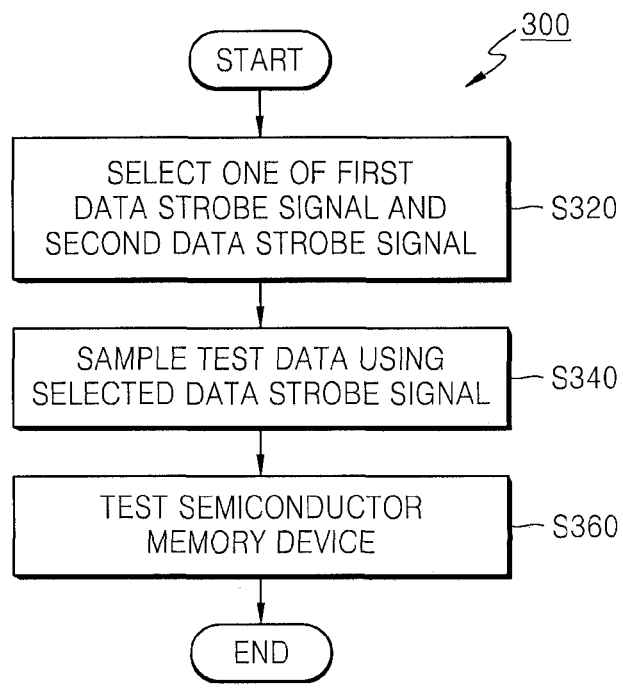
FIG. 3 is a flow chart of a method of testing a semiconductor memory device according to another embodiment of the present invention.

FIG. 3 is a flow chart of a method 300 of testing a semiconductor memory device according to another embodiment of the present invention. Referring to FIGS. 3 and 4, the method 300 begins by selecting one of a first data strobe signal (for example internal data strobe signal INT_DS generated from the internal clock signal INT_CLK of the semiconductor memory device 400) and a second data strobe signal (for example external data strobe signal EXT_DS input through a data strobe input pin of the semiconductor memory device 400) in operation S320. Then, in operation S340, the process samples test data using the selected data strobe signal. Finally, in operation S360, the process tests the semiconductor memory device 400 using the selected data strobe signal.

The first data strobe signal could be an internal data strobe signal INT_DS that is delayed by the replica path circuit 424, or delayed by both the replica path circuit 424 and the delay chain 426, as described previously. According to the test method 300 illustrated in FIG. 3, the data strobe signal DS can be internally generated or supplied from an external device depending on a user's choice.

As described above, the method and system for testing a semiconductor memory device according to the present invention can generate a data strobe signal from an internal clock signal of the semiconductor memory device, and thus there is no need to supply the data strobe signal from a test device to the semiconductor memory device. Accordingly, the present invention can increase the number of semiconductor memory modules that can be simultaneously tested and thus decrease a test time for a unit memory module.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of testing a semiconductor memory device, comprising:
   generating an internal data strobe signal by delaying an internal clock signal within the semiconductor memory device, wherein the generating the internal data strobe signal comprises:
      receiving an external clock signal in the semiconductor memory device from the test device;
      generating a temporary internal clock signal from the external clock signal by applying a first delay time; and
      delaying the temporary internal clock signal by a second delay time to generate the internal data strobe signal using a replica path circuit providing a fixed delay that models a period of time from when the external clock signal is applied to the semiconductor memory device to when the internal data strobe signal is output from the semiconductor memory device;
   receiving test data in the semiconductor memory device from a test device;
   sampling the test data using a data strobe derived from the internal data strobe signal; and
   testing the semiconductor memory device using the sampled test data.

2. The method of claim 1, wherein the temporary internal clock signal is generated using a delay locked loop circuit of the semiconductor memory device.

3. The method of claim 1, wherein the first delay time is longer than the second delay time.

4. The method of claim 1, wherein an external data strobe signal is not applied to a data strobe input pin of the semiconductor memory device.

5. A method of testing a semiconductor memory device, comprising:
   selecting one of an internal data strobe signal and an external data strobe signal, wherein the external data strobe signal is received in the semiconductor memory device from a test device;
   receiving test data in the semiconductor memory device from the test device;
   sampling the test data using the selected one of the internal data strobe signal and the external data strobe; and
   testing the semiconductor memory device using the sampled test data,
   wherein the internal data strobe signal is generated by delaying an internal clock signal within the semiconductor memory device, and generating the internal data strobe signal comprises:
      receiving an external clock signal in the semiconductor memory device from the test device;
      generating a temporary internal clock signal from the external clock signal by applying a first delay time; and
      delaying the temporary internal clock signal by a second delay time to generate the internal data strobe signal using a replica path circuit providing a fixed delay that models a period of time from when the external clock signal is applied to the semiconductor memory device to when the internal data strobe signal is output from the semiconductor memory device.

6. A semiconductor memory device comprising:
   a data strobe signal buffer configured to buffer an internal data strobe signal, and provide the buffered internal data strobe signal as a data strobe used to sample test data, wherein the semiconductor memory device is tested by a test device using the test data; and
   a data strobe signal generator configured to receive an external clock signal, generate an internal clock signal from the external clock signal, and generate the internal data strobe signal by delaying the internal clock signal, and comprising:
      a temporary internal clock generating circuit configured to receive the external clock signal and generate a temporary internal clock signal from the external clock signal; and
      a replica path circuit providing a fixed first delay time, configured to receive the temporary internal clock, and generate the internal data strobe by applying the first delay time to the temporary internal clock.

7. The semiconductor memory device of claim 6, wherein the temporary internal clock signal generating circuit is a delay locked loop circuit.

8. The semiconductor memory device of claim 6, wherein the fixed first delay time provided by the replica delay circuit models a period of time from when the external clock signal is applied to the semiconductor memory device to when the internal clock signal is output from the semiconductor memory device.

9. The semiconductor memory device of claim 6, further comprising a second delay circuit configured to receive the internal clock signal and generate the internal data strobe signal by applying a second delay time to the internal clock signal.

10. The semiconductor memory device of claim 9, wherein the second delay circuit is a delay chain and wherein the delay chain is configured to receive a mode register set signal.

* * * * *